United States Patent
Aoki et al.

(10) Patent No.: US 9,101,965 B2
(45) Date of Patent: Aug. 11, 2015

(54) HIGH-PRESSURE WASHING LIQUID EJECTING WASHING APPARATUS

(75) Inventors: Yoshiaki Aoki, Kobe (JP); Morimasa Kuge, Kobe (JP); Keiji Tsujita, Kobe (JP); Hideyuki Tanaka, Kobe (JP); Mitsuru Nomura, Kobe (JP)

(73) Assignee: KAWASAKI JUKOGYO KABUSHIKI KAISHA, Kobe-Shi (JP)

( * ) Notice: Subject to any disclaimer, the term of this patent is extended or adjusted under 35 U.S.C. 154(b) by 1060 days.

(21) Appl. No.: 13/058,997

(22) PCT Filed: Jul. 17, 2009

(86) PCT No.: PCT/JP2009/003382
§ 371 (c)(1),
(2), (4) Date: Apr. 26, 2011

(87) PCT Pub. No.: WO2010/021080
PCT Pub. Date: Feb. 25, 2010

(65) Prior Publication Data
US 2011/0197939 A1 Aug. 18, 2011

(30) Foreign Application Priority Data
Aug. 22, 2008 (JP) .................................. 2008-213878

(51) Int. Cl.
*B08B 3/02* (2006.01)
*B05B 1/20* (2006.01)
(Continued)

(52) U.S. Cl.
CPC ................. *B08B 3/022* (2013.01); *B05B 1/202* (2013.01); *B05B 13/0468* (2013.01); *H01L 21/67051* (2013.01)

(58) Field of Classification Search
CPC ................ B05B 1/202; B05B 13/0468; H01L 21/67051; B08B 3/022
USPC ........................................................ 134/198
See application file for complete search history.

(56) References Cited

U.S. PATENT DOCUMENTS 5,945,346 A * 8/1999 Vanell et al. .................. 438/691
6,334,902 B1 * 1/2002 Mertens et al. .................... 134/1
(Continued)

FOREIGN PATENT DOCUMENTS

JP  A-1-132780  5/1989
JP  A-08-243514  9/1996
(Continued)

OTHER PUBLICATIONS

International Search Report issued in Application PCT/JP2009/003382; Dated Oct. 20, 2009.

*Primary Examiner* — Michael Barr
*Assistant Examiner* — Benjamin L Osterhout
(74) *Attorney, Agent, or Firm* — Oliff PLC

(57) ABSTRACT

A high-pressure washing liquid ejecting washing apparatus comprises a bar-shaped holder; and a plurality of high-pressure washing liquid ejecting nozzles arranged at constant intervals along a longitudinal direction of the bar-shaped holder, the holder being supported at both sides in a longitudinal direction thereof such that the holder is rotatable around its longitudinal axis, the holder being reciprocatingly rotated around the longitudinal axis within a predetermined rotational angle and the ejecting nozzles ejecting a high-pressure washing liquid to a washed surface of an object in a single straight-line shape to wash the object while the object is conveyed at a constant speed with respect to the holder, wherein the holder has a length which is not less than a length across the object and is disposed such that the holder is orthogonal to a direction in which the object is conveyed or is tilted with respect to the direction in which the object is conveyed, when viewed from a normal line direction of the washed surface.

9 Claims, 17 Drawing Sheets

(51) Int. Cl.
*B05B 13/04* (2006.01)
*H01L 21/67* (2006.01)

(56) References Cited

U.S. PATENT DOCUMENTS

| | | | |
|---|---|---|---|
| 6,527,861 B2 * | 3/2003 | Takekuma | 118/54 |
| 6,528,425 B1 | 3/2003 | Uraguchi et al. | |
| 2002/0121289 A1 * | 9/2002 | Brown et al. | 134/6 |
| 2006/0112980 A1 * | 6/2006 | Jeong et al. | 134/137 |

FOREIGN PATENT DOCUMENTS

| | | |
|---|---|---|
| JP | A-2002-045803 | 2/2002 |
| JP | A-2005-238109 | 9/2005 |
| JP | A-2006-010947 | 1/2006 |
| JP | B2-3766968 | 4/2006 |
| JP | A-2009-106845 | 5/2009 |
| KR | 10-1998-0064538 | 10/1998 |

\* cited by examiner

CROSS-SECTION ALONG A-A

CROSS-SECTION ALONG B-B

CROSS-SECTION ALONG C-C

HIGH-PRESSURE WASHING LIQUID EJECTING WASHING APPARATUS

TECHNICAL FIELD

The present invention generally relates to a high-pressure washing liquid ejecting washing apparatus (also referred to as a water jet washing machine) which ejects a high-pressure washing liquid to flat plate materials such as FPDs (flat panel displays), for example, liquid crystal panels, plasma panels, solar panels, or organic EL (electro luminance) panels, large-sized plate glasses, or semiconductor wafers, and washes them. More specifically, the present invention relates to a high-pressure washing liquid ejecting washing apparatus which is used to eject a high-pressure washing liquid (including high-pressure water) to remove contaminants which cause a low yield, such as fine particles, organic matters, metal impurities on glass substrate surfaces in manufacturing steps of the liquid crystal displays or the semiconductor wafers, has a simple structure and achieves a cost reduction.

BACKGROUND ART

As the above high-pressure washing liquid ejecting washing apparatus, there has been proposed an apparatus in which a holder attached with a plurality of high-pressure washing liquid ejecting nozzles arranged is rotated (moved in a circular shape) or pivoted in a conical shape to eject a high-pressure washing liquid from the washing apparatus to objects in a direction perpendicular to the objects, thereby washing surfaces of the objects with the high-pressure washing liquid ejected from the ejecting nozzles (e.g., see Japanese Patent No. 2705719). This apparatus includes convergent nozzles which eject the high-pressure washing liquid in a single straight-line shape.

Commonly, nozzles used in the conventional washing apparatus are cone-type nozzles ejecting a washing liquid spreading in a conical shape or fan-type nozzles ejecting a washing liquid spreading in a sector shape. When these nozzles are used, it is not necessary to rotate the holder in a circular shape or pivot it because a jet of the washing water diffuses with a great width, unlike the apparatus disclosed in the above publication.

On the other hand, the washing apparatus in the above publication uses the convergent ejecting nozzles ejecting the washing liquid in a single straight-line shape without diffusing, and therefore, an energy density of the ejected washing liquid is very high and is several tens times as high as that of the cone-type nozzles or the fan-type nozzles. This can remove the contaminants on the washed surface and wash the objects very effectively. However, regions (areas) of the objects to which the washing liquid is applied are very small, and only localized regions are washed. In other words, regions to which the washing water is not applied are large and these regions cannot be washed.

As a solution to this, the present inventors discovered a high-pressure washing liquid ejecting washing method and apparatus in which a plurality of high-pressure washing liquid ejecting nozzles eject a washing liquid in a single straight-line shape to the objects to wash them, while moving the objects at a constant speed, the high-pressure washing liquid ejecting nozzles are arranged on a common holder to be spaced apart from each other and are oriented in the same direction so as to face the objects, and the high-pressure washing liquid ejecting nozzles are rotated integrally with the holder to eject the high-pressure washing liquid to the objects and filed a patent application (Japanese Patent Application No. 2007-281322).

As another prior art associated with the above washing apparatus, there is disclosed a washing apparatus including a detector means for detecting specified regions attached with more contaminants than those of other regions within surfaces of the objects, a retaining means for retaining the objects in a tilted state along a direction in which the objects are conveyed, a conveyor means for conveying the objects retained by the retaining means in the conveying direction, a discharge means for discharging a washing liquid to the surfaces of the objects, and a moving means for moving the discharge means along a width direction of the objects which is orthogonal to the conveying direction, within the surface of the object, and the discharge means selectively discharges the washing liquid to the specified regions (see for example, Japanese Laid-Open Patent Application Publication No. 2006-10947).

SUMMARY OF THE INVENTION

Technical Problem

As described above, the washing density increases as a rotational speed for rotating the holder in a circular shape is increased, but the holder or the overall apparatus including the holder vibrates growingly. This vibration acceleration increases with a square of the rotational speed. Therefore, in a hand-held washing apparatus disclosed in U.S. Pat. No. 2,705,719, it is difficult for an operator to continue a washing operation while holding the washing apparatus with hands. If the number of nozzles attached on the holder is made twice or three times more, an overall length of the holder increases, and an outer diameter of the holder increases significantly. This is unsuitable as the hand-held washing apparatus.

The apparatus disclosed in Japanese Laid-Open Patent Application Publication No. 2006-10947 is adapted to intensively wash the specified regions of the objects which are attached with more contaminants and not to wash the entire objects uniformly.

A washing apparatus 70 disclosed in the above previous application has a configuration in which a holder 71 attached with a plurality of high-pressure water ejecting nozzles 72 are rotated in a circular shape within a horizontal plane by eccentric rotation of drive shafts 74 at both sides of the holder 71 to carry out washing, as shown in FIG. 12. For this reason, a bending moment of an isosceles triangle shape acts on the holder 71 by a force in Y-direction in FIG. 12. Therefore, the holder 71 needs to have a cross-sectional stiffness to withstand the bending moment. To increase the stiffness of the holder 71, the apparatus increases in size and weight. Correspondingly, eccentric rotation drive units 73 and drive motors at both sides must be enhanced in performance, causing a high cost and an increased vibration to outside things. To ensure a closed washing room 76, it is necessary to provide a predetermined gap (in the direction of arrows G in FIG. 12) between each of supports 75 extending laterally from both sides of the holder 71 rotatable in a circular-shape and the corresponding side wall 77 and to seal the gap. Such a seal structure is complex.

The present invention has been developed under the circumstances, and an object of the present invention is to provide a high-pressure washing liquid ejecting washing apparatus which is simpler in structure than the washing apparatus of the previous application, and achieves reduction of a size, a weight, and a cost, suppress a vibration of the apparatus during washing, and enables uniform and efficient washing.

Solution to Problem

To solve the above problem, a high-pressure washing liquid ejecting washing apparatus of the present invention comprises a bar-shaped holder; and a plurality of high-pressure washing liquid ejecting nozzles arranged at constant intervals along a longitudinal direction of the bar-shaped holder, the holder being supported at both sides in a longitudinal direction thereof such that the holder is rotatable around its longitudinal axis, the holder being reciprocatingly rotated around the longitudinal axis within a predetermined rotational angle and the ejecting nozzles ejecting a high-pressure washing liquid to a washed surface of an object in a single straight-line shape to wash the object while the object is conveyed at a constant speed with respect to the holder, wherein the holder has a length which is not less than a length across the object and is disposed such that the holder is orthogonal to a direction in which the object is conveyed or is tilted with respect to the direction in which the object is conveyed, when viewed from a normal line direction of the washed surface.

In accordance with the above configuration, the plurality of high-pressure washing liquid ejecting nozzles perform a reciprocating rotational movement (rotational movement occurring clockwise and counterclockwise alternately in repetition) within a predetermined rotational angle around the longitudinal axis of the holder, along with the holder, and the plurality of ejecting nozzles eject the high-pressure washing liquid in a straight-line shape. Therefore, a high washing ability is obtained. In addition, the holder reciprocatingly rotates with the predetermined rotational angle in the direction orthogonal to the longitudinal direction of the holder and the high-pressure washing liquid is ejected uniformly to the substantially entire object over a width direction. Thus, washing unevenness is less likely to occur. Furthermore, if a movement speed of the object is increased, a reciprocating rotation time is reduced, or a reciprocating rotational angle is reduced to achieve high-speed washing, a vibration acceleration of the holder or the overall apparatus including the holder does not increase and a vibration is suppressed.

The ejecting nozzles may be arranged along the longitudinal direction of the holder on a lower surface of the holder; the holder may be provided with a high-pressure washing liquid feed passage which extends along the longitudinal direction of the holder in a straight-line shape and communicates with the ejecting nozzles; one end of a flexible high-pressure washing liquid feed pipe may be coupled to an end portion of the high-pressure washing liquid feed passage; and rotary shafts may be attached to longitudinal both end surfaces of the holder such that the rotary shafts are rotatable integrally with the holder.

In accordance with this configuration, the rotary shafts at the both sides of the holder are rotatably supported by, for example, bearings, and a reciprocating rotational force is given to the holder via a crank mechanism, a motor, etc to reciprocatingly rotate it. The holder is pivoted around the axis with a pivot range (rotational angle θ) which is as small as about 10 degrees to 30 degrees. Therefore, the flexible high-pressure washing liquid feed pipe is bent to absorb a displacement of the end portion of the holder during the pivot movement of the holder. The high-pressure washing liquid supplied to the high-pressure washing liquid feed passage through the high-pressure washing liquid feed pipe is ejected substantially uniformly from the ejecting nozzles facing (communicating with) the high-pressure washing liquid feed passage.

The holder may be a block body having a rectangular cross-section in a direction orthogonal to the longitudinal direction of the holder, tubular members with a rectangular cross-section which open toward the holder may be provided integrally with one end portions of the rotary shafts, both end portions of the block body may be fittingly inserted into the tubular members, respectively, and each of the end portions of the block body may be fastened integrally to the tubular member by a bolt penetrating the end portion of the block body and the tubular member.

In accordance with this configuration, the holder formed by the block body is surely attached integrally to the rotary shaft and it is possible to prevent the bolt from coming loose and the rotary shaft from disengaging from the holder inadvertently.

The holder may be supported at both sides thereof such that the holder is rotatable around the longitudinal axis and is movable along the longitudinal direction. The holder may be disposed to extend in a direction orthogonal to the direction in which the object is conveyed. The holder may be reciprocatingly rotatable around the longitudinal axis within a predetermined rotational angle and is reciprocatingly movable within a predetermined dimension in the longitudinal direction.

In accordance with this configuration, the holder is rotated (pivoted) along the longitudinal axis and performs a reciprocating movement (reciprocating movement in a straight line direction) in the longitudinal direction (long axis) of the holder while the washing liquid is ejected under a high-pressure from a plurality of ejecting nozzles. For this reason, the holder may be disposed to extend in the direction orthogonal to the direction in which the object is conveyed. In other words, it is not necessary to tilt the holder with respect to the direction in which the object is conveyed. This reduces a space in which the holder is installed. In addition, there is a time lag between a direction changing point around the longitudinal axis of the holder and a direction changing point in the longitudinal direction of the holder, and therefore, the high-pressure washing liquid is not ejected intensively to a specified region on the object.

A common motor may give a rotational force to the rotary shafts of the holder to reciprocatingly rotate the rotary shafts around the longitudinal axis while permitting a reciprocating movement of the rotary shafts in the longitudinal direction, and may give a force (reciprocating driving force in a straight line direction) to the rotary shafts of the holder to cause the rotary shaft to perform a reciprocating linear movement in the longitudinal direction while permitting a rotation of the rotary shafts around the longitudinal direction.

In accordance with this configuration, the holder performs a reciprocating movement smoothly in a straight-line shape at constant pitches in the longitudinal direction while pivoting the holder around the longitudinal axis. Therefore, the high-pressure washing liquid is ejected to the object so as to draw a desired oval shape as well as a circular shape to wash it, and washing uniformity is ensured flexibly. In addition, the common motor causes the holder to perform the pivot movement and the reciprocating movement in the longitudinal direction concurrently. Thus, two operations can occur in synchronization with a simple structure.

A reciprocating rotation stroke distance of the holder around the longitudinal axis may be equal to a reciprocating stroke distance of the holder in the longitudinal direction.

In accordance with this configuration, the washing liquid can be ejected to the object so as to draw a perfect circle shape. The high-pressure washing liquid ejecting washing apparatus of the present invention has a simpler structure than the high-pressure washing liquid ejecting washing apparatus of a previous application, and achieves substantially the same washing action as that of the high-pressure washing liquid ejecting washing apparatus of the previous application. An acceleration of the holder in the forward and backward direction is balanced more easily than that of the washing apparatus of the previous application. Therefore, the washing liquid ejecting washing apparatus of the present invention is handled easily.

Advantageous Effects of the Invention

The high-pressure washing liquid ejecting washing apparatus of the present invention has the above configuration and achieves the following advantageous effects. To be specific, a plurality of ejecting nozzles reciprocatingly rotate within a predetermined angle range around the longitudinal axis along with the holder. During this rotation, the plurality of ejecting nozzles eject the washing liquid to the object under a high-pressure. When the holder is reciprocatingly pivoted around the longitudinal axis, the holder is tilted (e.g., tilting angle of 10 degrees to 20 degrees) with respect to the direction in which the object is conveyed, as shown in FIG. 1A, thereby forming a washing trajectory with a zigzag shape (bellows shape) as shown in FIG. 8B. Thereby, a washing region with a constant width is formed over a width (direction orthogonal to the direction in which the object is conveyed) of the object. Since the object is conveyed at a constant speed to get across the washing region, the washing liquid is ejected to the entire surface of the object uniformly and with a high washing density under a high-pressure, a high washing ability is obtained and washing unevenness is less likely to be generated. Since the holder is pivoted around the axis to perform washing, a vibration acceleration is not increased and a vibration is suppressed even if a high-speed operation is achieved. Thus, a washing effect with a high washing density is obtained. The washing apparatus of the present invention can reduce stiffness of the holder, reduce a weight of a rotation support structure such as bearings, reduce a vibration, and significantly reduce a manufacturing cost, as compared to the washing apparatus of the previous application in which the holder is rotated within a horizontal plane.

The washing apparatus of the present invention is installed within a washing room closed, called a clean room, without a need to a provide a gap (between holder support portion 75 and washing room side wall 77) shown in FIG. 12, and therefore a seal mechanism is simplified.

Since the holder performs the reciprocating linear movement in the longitudinal direction in addition to the reciprocating rotation around the longitudinal axis, the washing liquid is ejected to the object so as to draw a perfect circle shape or an oval shape and wash it, a washing performance which is substantially as high as that of the washing apparatus of the previous application is attained, a structure is simple and a significant cost reduction is achieved as compared the washing apparatus of the previous application. In addition, by adjusting a timing of the reciprocating linear movement of the holder and a stroke distance of the holder, a washing trajectory with a desired oval shape as well as a washing trajectory with a perfect circle shape is drawn. As a result, washing uniformity is achieved with higher flexibility.

DESCRIPTION OF THE EMBODIMENTS

Hereinafter, an embodiment of a high-pressure washing liquid ejecting washing apparatus 1 of the present invention will be described.

Figure 1A:
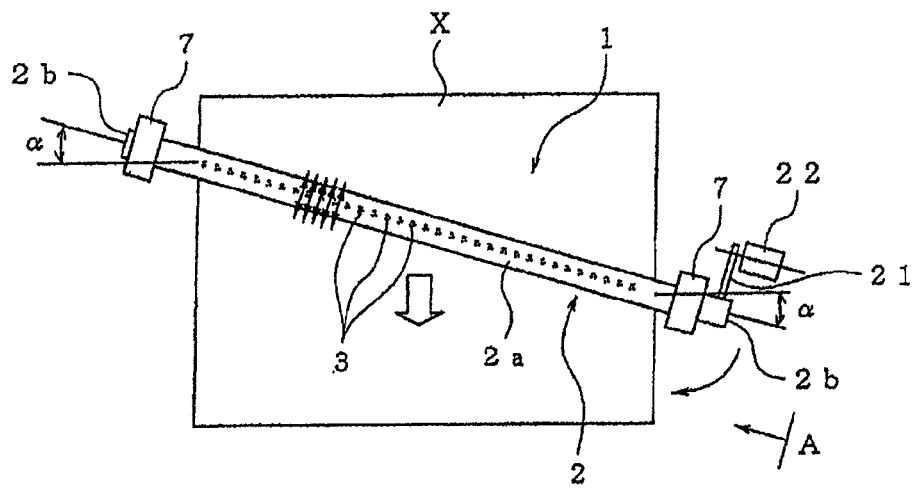
FIG. 1A is a plan view of a high-pressure washing liquid ejecting washing apparatus according to Embodiment 1 of the present invention.
Figure 1B:
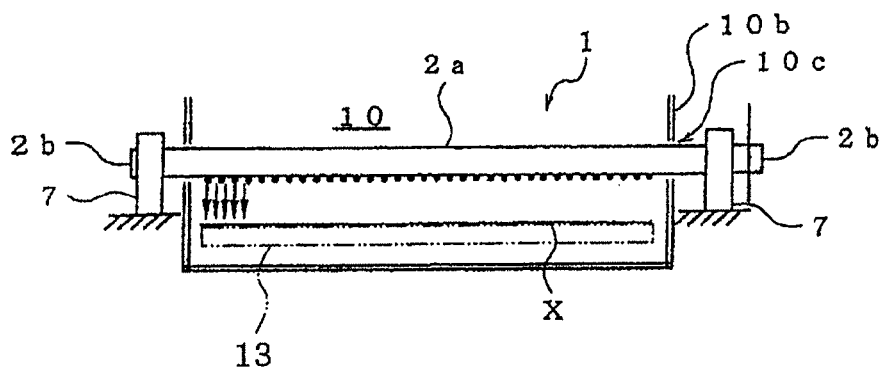
FIG. 1B is a front view of the high-pressure washing liquid ejecting washing apparatus of FIG. 1A.
Figure 1C:
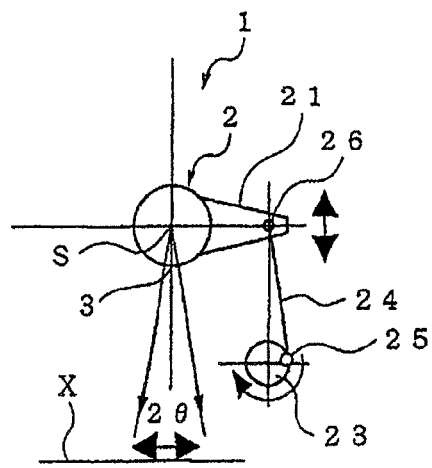
FIG. 1C is a view taken in the direction of arrows along A.
Figure 2A:
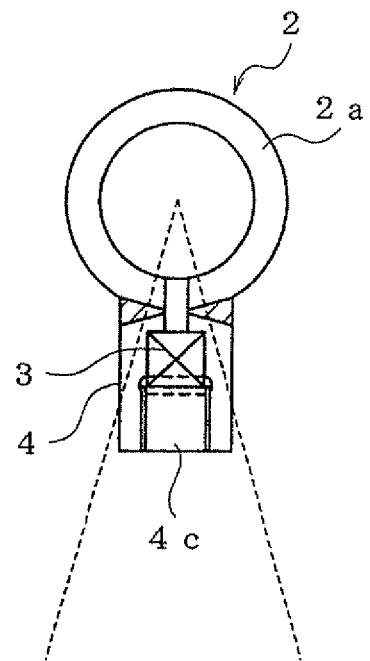
FIG. 2A is a cross-sectional view of a holder of the high-pressure washing liquid ejecting washing apparatus of FIG. 1A.
Figure 11A:
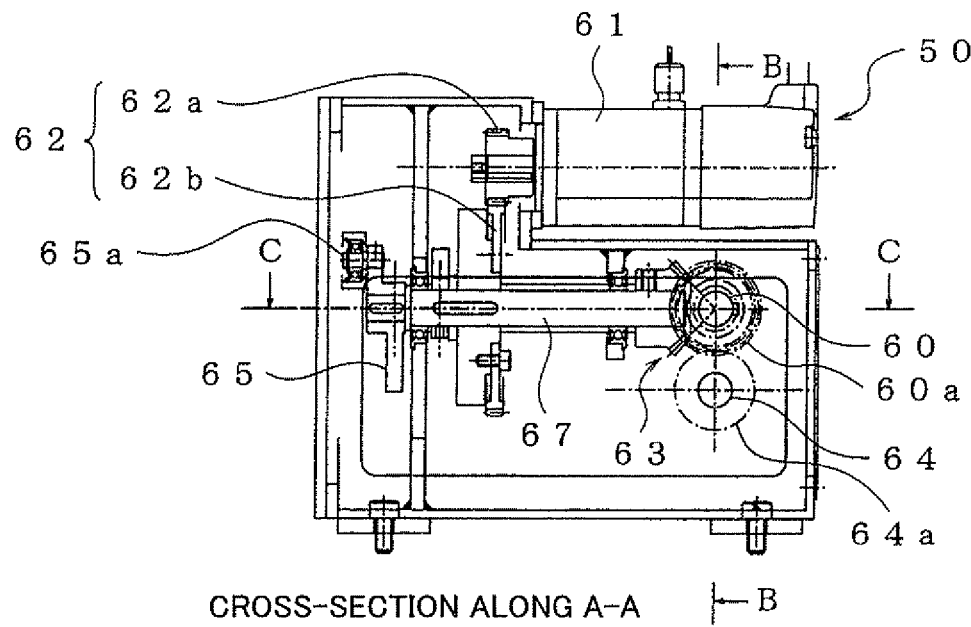
FIG. 11A is a view showing a detailed configuration of modification example of the drive mechanism of the high-pressure washing liquid ejecting washing apparatus, taken along A-A of FIG. 11C.
Figure 11B:
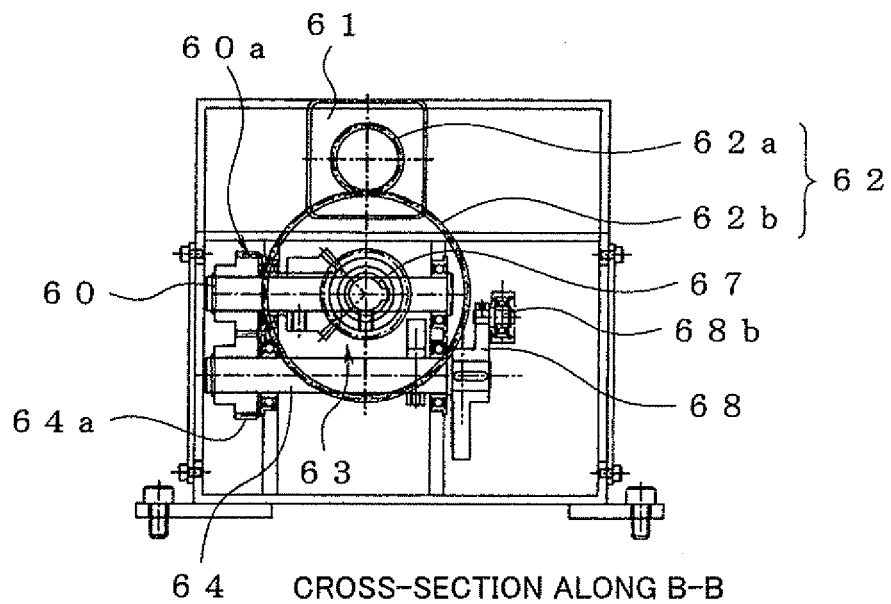
FIG. 11B is a cross-sectional view taken along B-B of FIG. 11A.

FIG. 1A is a plan view of a high-pressure washing liquid ejecting washing apparatus 1 according to Embodiment 1 of the present invention. FIG. 1B is a front view of the high-pressure washing liquid ejecting washing apparatus 1 of FIG. 1A. FIG. 1C is a view taken in the direction of arrows along A of FIG. 11A. FIG. 2A is a cross-sectional view of a holder 2 of the high-pressure washing liquid ejecting washing apparatus 1 of FIG. 1A.

As shown in FIGS. 1A~1C, the high-pressure washing liquid ejecting washing apparatus 1 is a swingable (pivotable or reciprocatingly rotatable) washing apparatus, and includes a holder 2 with a circular cross-section. As shown in FIG. 2A, for example, the holder 2 has a structure in which a block-like nozzle unit 4 which is open at a lower end 4a is integrally attached by welding to a lower surface of a cylindrical pipe body 2a in a longitudinal direction and a plurality of high-pressure washing liquid ejecting nozzles 3 are arranged within the nozzle unit 4 to be spaced apart from each other.

As shown in FIG. 1A, the high-pressure washing liquid ejecting washing apparatus 1 is configured in such a manner that the holder 2 is tilted at about an angle α with respect to a width direction of a rectangular object x and a length of the holder body 2a is not less than a length (length in width direction) across the object x, when viewed from above in a normal line direction of a washed surface of the object x. To be more specific, the holder 2 is disposed such that its longitudinal both ends protrude from the object x when viewed from above. At both sides of the holder 2 outside a washing room 10, rotary shafts 2b are supported by bearing devices 7, respectively such that they are rotatable around a longitudinal axis of the holder 2. Each bearing device 7 is formed by a support base including a bearing. As shown in FIG. 1B, the body 2a is disposed inside the washing room 10, and the rotary shafts 2b protrude outward through side walls 10b of the washing room 10 extending vertically. An opening space 10c is formed on each side wall 10b through which the rotary shaft 2b protrudes outward, and a ring-shaped seal is which is not shown is mounted in a gap between the opening space 10c and the rotary shaft 2b.

Figure 4A:
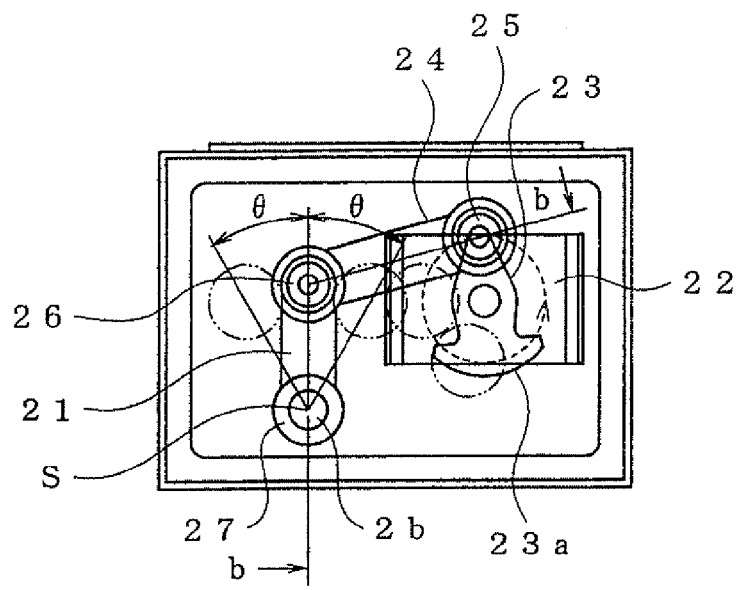
FIG. 4A is a side view showing a piston and crank mechanism of the washing apparatus of FIG. 1.
Figure 4B:
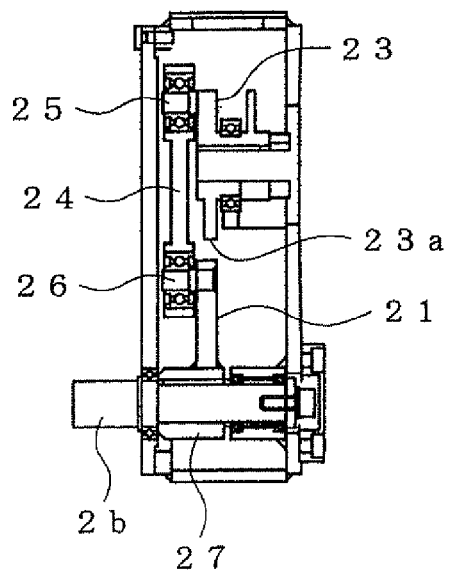
FIG. 4B is a cross-sectional view taken along b-b of FIG. 4A.

The holder 2 is reciprocatingly rotatable within a predetermined rotational angle θ around its longitudinal axis by a piston and crank mechanism. As shown in FIG. 4B, one end of a lever 21 is attached to the rotary shaft 2b by a sleeve-like rotation transmission member 27 such that the lever 21 is rotatable integrally with the rotary shaft 2b. As shown in FIG. 4A, one end of a crank 23 rotatable in one direction (e.g., clockwise) by a servo motor 22 is coupled to an opposite end of the lever 21 via a connecting rod 24 such that the crank 23 and the lever 21 are rotatable by a crank pin 25 and a piston pin 26. A counterweight 23a is provided integrally at an opposite end side (opposite side of the crank pin 25) of the crank 23. With this configuration, when the crank 23 rotates in one direction (e.g., clockwise), the piston pin 26 of the lever 21 reciprocatingly rotates by θ (e.g., 30 degrees) around the rotary shaft 2b to reciprocatingly rotate the rotary shaft 2b around a center location S. Thereby, the holder 2 reciprocatingly rotates by the rotational angle θ around its longitudinal axis and pivoted, so that a washing liquid is ejected under a high-pressure from respective ejecting nozzles 3 on the lower surface of the holder 2 to surfaces of the objects x.

Figure 5A:
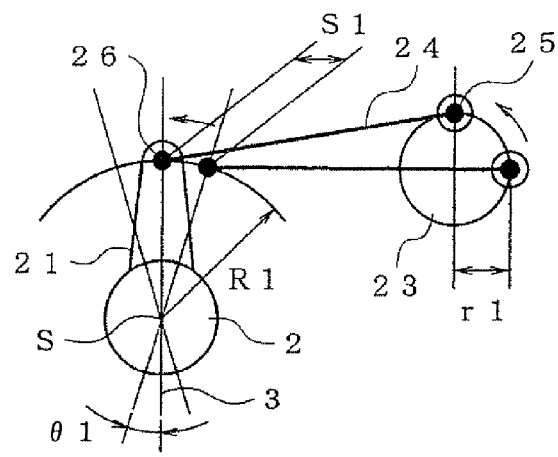
FIG. 5A is a view showing a method for changing a pivot angle θ of the holder (ejecting nozzle) in the piston and crank mechanism of FIG. 4.

In this embodiment, the ejecting nozzles 3 are designed to reciprocatingly rotate by θ1 of 30 degrees around the rotational center S of the holder 2. As shown in FIG. 5A, a rotation radius of the crank 23 is r1 and a rotation radius of the lever 21 is R1. In this case, a pivot stroke of the lever 2 is S1.

Figure 5B:
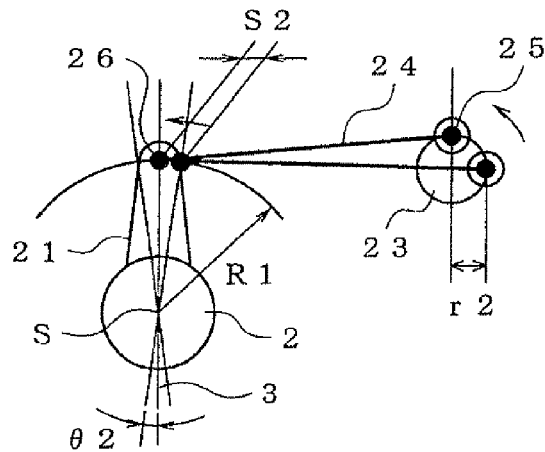
FIG. 5B is a view showing a method for changing the pivot angle θ of the holder (ejecting nozzle) in the piston and crank mechanism of FIG. 4.
Figure 5C:
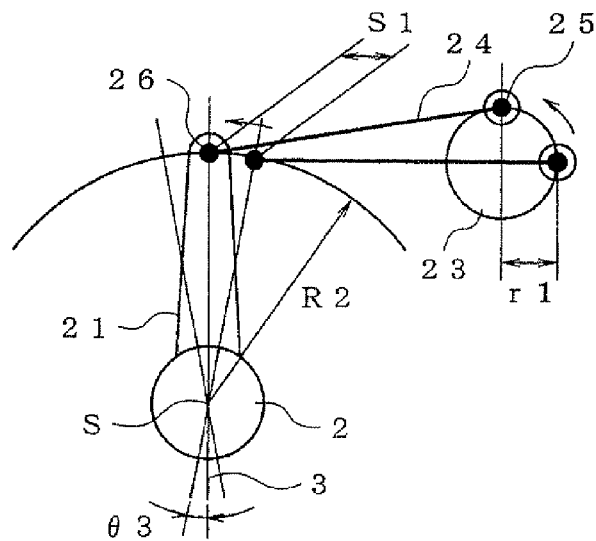
FIG. 5C is a view showing a method for changing the pivot angle θ of the holder (ejecting nozzle) in the piston and crank mechanism of FIG. 4.

To make the rotational angle θ smaller than θ1, a rotational angle θ2 and a pivot stroke S2 can be made smaller than θ1 and S1, respectively by reducing the rotation radius of the crank 23 from, for example, r1 to r2, as shown in FIG. 5B. For example, as shown in FIG. 5C, if the rotation radius R1 of the lever 21 is increased to R2, the pivot stroke of the lever 21 is S1, but a rotational angle θ3 is smaller than θ1.

The washing liquid (including washing water) ejected from each ejecting nozzle 3 is ejected in a single straight-line shape under a high-pressure. The washing liquid of the single straight-line shape, which is ejected from the ejecting nozzle 3, has a higher washing ability (washing force). Although the washing liquid ejected from each ejecting nozzle 3 is a single straight-line shape, the holder 2 is pivoted around its longitudinal axis in a state where the holder 2 is slightly tilted with respect to the width direction of the object x, and the object x is conveyed at a predetermined speed by a conveyor mechanism 13 such as a roller conveyor. Therefore, by adjusting the speeds of the holder 2 and the object x, the substantially entire surface of the object x can be washed.

Figure 2B:
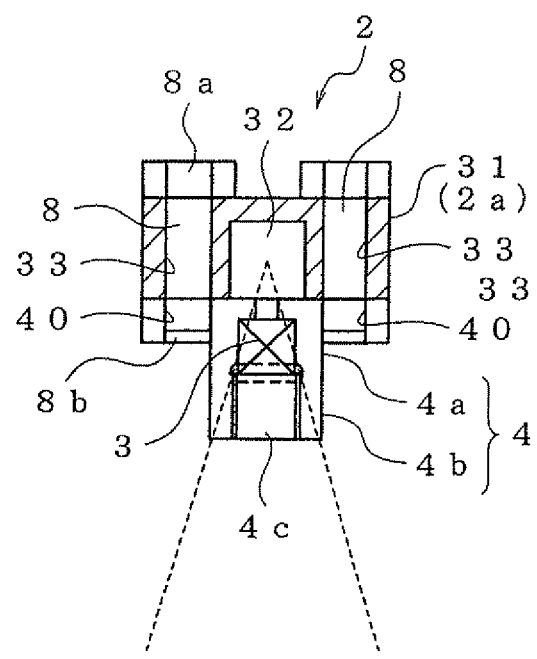
FIG. 2B is a cross-sectional view of the holder according to modification example 1.
Figure 2C:
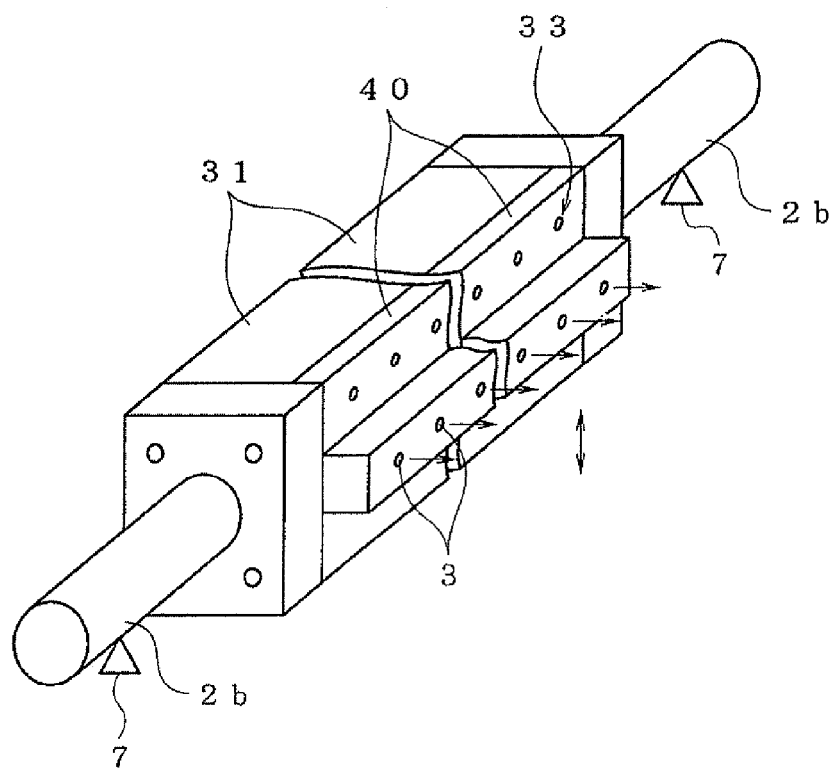
FIG. 2C is a perspective view schematically showing an external appearance of the entire holder of FIG. 2B.

FIG. 2B is a cross-sectional view of the holder 2 according to modification example 1. FIG. 2C is a perspective view schematically showing an external appearance of the entire holder of FIG. 2B. In this example, the body 2a of the holder 2 is formed by a bar-like block body 31 of a tube shape with a rectangular cross-section. The block body 31 has at a center axis portion thereof a high-pressure washing liquid feed passage 32 with a rectangular cross-section, extending along a longitudinal direction thereof. The block body 31 has a plurality of through-holes 33 formed vertically at locations between which the high-pressure washing liquid feed passage 32 is interposed, at longitudinal both end portions or at locations spaced apart from each other in the longitudinal direction thereof. The nozzle unit 4 is integrally fastened to the lower surface of the body 2a by bolts 8 with heads 8a, and is formed by a block body having a tube shape with a rectangular cross-section and the open lower end 4c and extending continuously in the longitudinal direction. The nozzle unit 4 has threaded holes 40 into which threaded portions 8b of the bolts 8 are threaded, with the ejecting nozzle 3 interposed between them. In this example, the holder 2 is coupled by large-sized bolts. A washing liquid feed pipe 9 (see FIG. 3B) such as a high-pressure hose formed of flexible metal or flexible rubber and reinforced by winding a metal blade (wire) around its outer peripheral surface is coupled to one end portion of the high-pressure washing liquid feed passage 32.

Figure 2D:
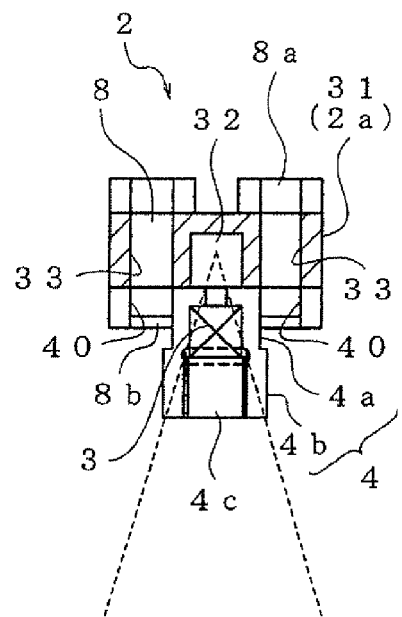
FIG. 2D is a cross-sectional view of the holder according to modification example 2.

FIG. 2D shows modification example 2 of the holder 2. The holder 2 of FIG. 2D is basically identical to that of FIG. 2B and is different from the same in that a size and a weight are reduced in the holder 2 of FIG. 2D. In this example, the holder 2 of FIG. 2D is different in that since the high-pressure washing liquid feed passage 32 has a smaller cross-sectional area, the washing liquid feed pipe 9 is coupled to each of both end portions of the high-pressure washing liquid feed passage 32. In addition, the holder 2 of FIG. 2D is different in that since a cylindrical potion 4b below the cylindrical portion 4a is larger in outer diameter than the cylindrical portion 4a of the nozzle unit 4 to which the ejecting nozzle 3 is mounted.

Figure 3A:
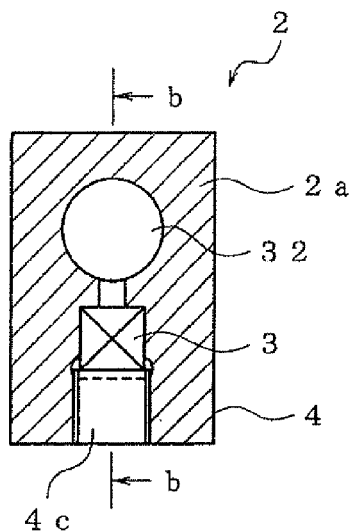
FIG. 3A is a cross-sectional view of the holder according to modification example 3, taken along a-a of FIG. 3B.
Figure 3B:
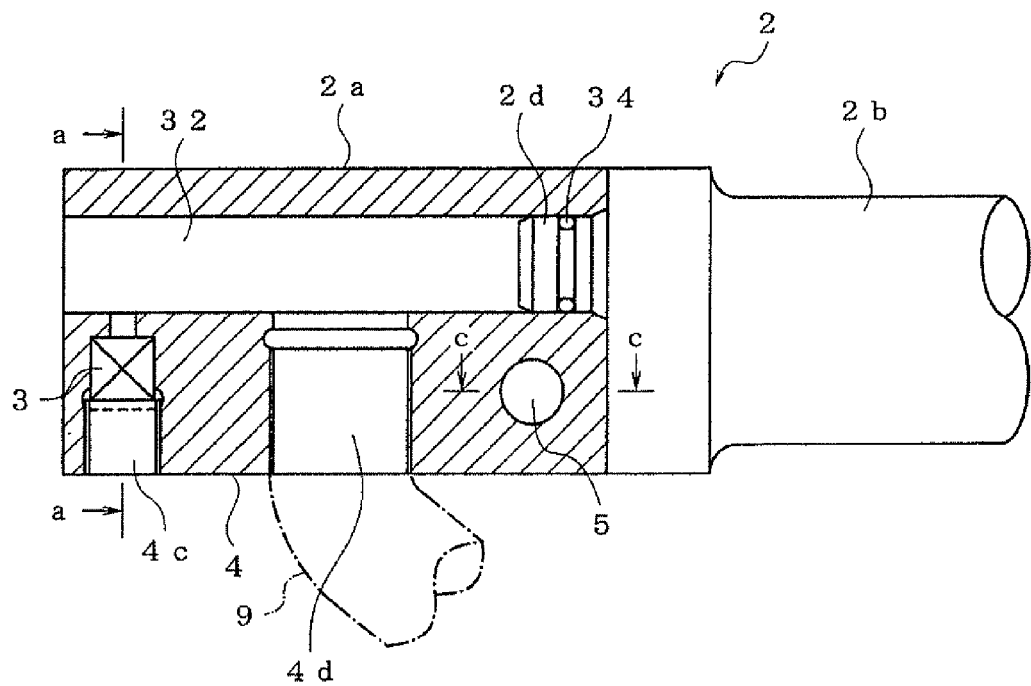
FIG. 3B is a cross-sectional view taken along b-b of FIG. 3A.
Figure 3C:
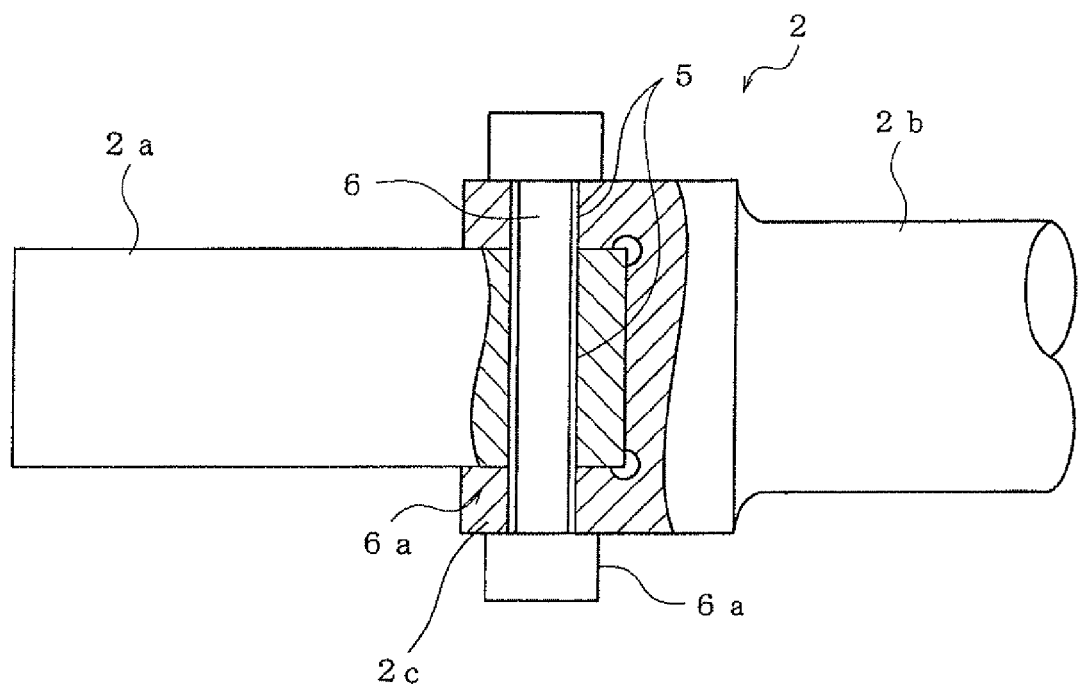
FIG. 3C is a cross-sectional view taken along c-c of FIG. 3B.
Figure 9A:
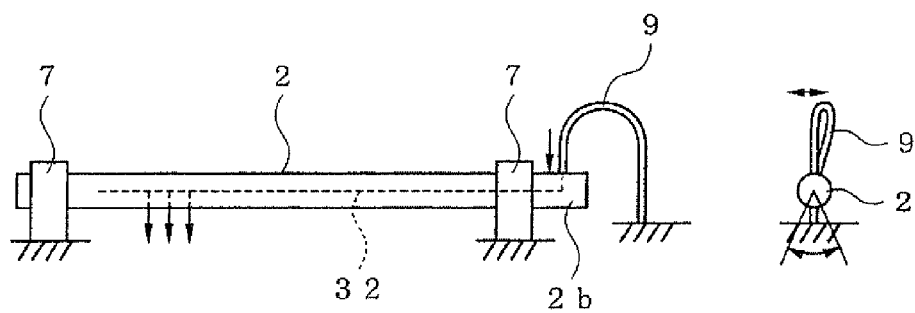
FIG. 9A is a front view and a side view of a state where a washing liquid feed pipe is coupled to one end of the holder of the washing apparatus of FIG. 1.
Figure 9B:
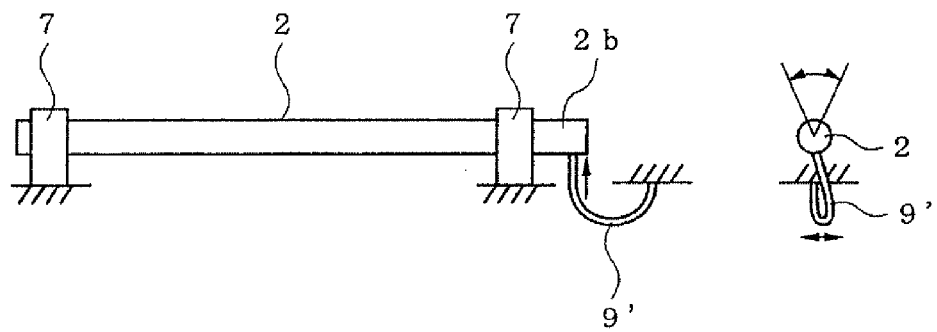
FIG. 9B is a front view and a side view of the washing liquid feed pipe according to modification example 1, and a state where the washing liquid feed pipe which is a high-pressure hose is coupled.
Figure 9C:
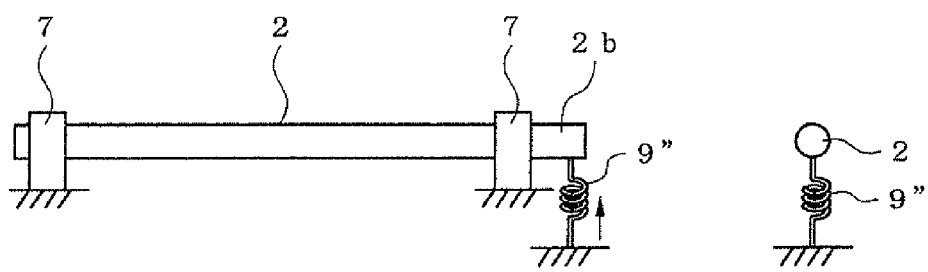
FIG. 9C is a front view and a side view of the washing liquid feed pipe according to modification example 2, and a state where a spiral metal-made washing liquid feed pipe is coupled.
Figure 9D:
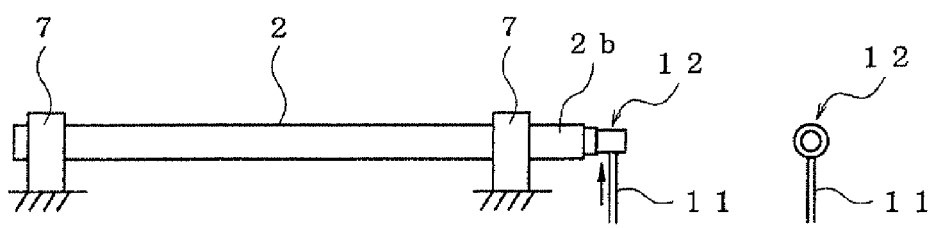
FIG. 9D is a front view and a side view of the washing liquid feed pipe according to modification example 3, and a state where one end of a stiff fixed washing liquid feed pipe is coupled to an end portion of a rotary shaft via a swivel joint.

FIGS. 3A~3C are cross-sectional views showing modification example 3 of the holder 2. The body 2a is formed of a block body of a tube shape with a rectangular cross-section. As shown in FIG. 3A, the body 2a is integral with the nozzle unit 4, and is provided with the high-pressure washing liquid feed passage 32 with a circular cross-section extending along the longitudinal direction. The holder 2 is provided with the rotary shafts 2b at both sides of the body 2a such that the rotary shaft 2b are rotatable integrally with the body 2a. To be specific, as shown in FIG. 3C, a horse-shoe portion 2c is provided integrally at one end portion of the rotary shaft 2b such that the horse-shoe portion 2c opens in a portion facing the body 2a and opens in upper and lower sides. The body 2a and the both side portions of the nozzle unit 4a are fittingly inserted into the horse-shoe portions 2c of the respective rotary shafts 2b. A through-hole 5 is formed through the end portion of the horse-shoe portion 2c and the end portion of the nozzle unit 4 to penetrate laterally, as shown in FIGS. 3B and 3C. They are coupled integrally in such a manner that a bolt 6 is inserted through the through-hole 5, a nut 6a is threadingly engaged therewith, and the bolt 6 and the nut 6a are tightened together. As shown in FIG. 3B, the rotary shaft 2b is provided with a cylindrical protrusion 2d which is fitted into the high-pressure washing liquid feed passage 32. The protrusion 2d is fitted into the end portion of the high-pressure washing liquid feed passage 32 in a state where an O-ring 34 is fitted around the protrusion 2d, thereby sealing it. A connecting hole 4d is formed at the end portion of the nozzle unit 4 to connect the high-pressure washing liquid feed pipe 9 such that the connecting hole 4d faces the high-pressure washing liquid feed passage 32. As shown in FIG. 9A, one end of the metal-made feed pipe 9 which is flexible is connected to the high-pressure washing liquid feed passage 32. The opposite end of the metal-made feed pipe 9 is connected to a high-pressure washing liquid pump (not shown). The high-pressure washing liquid pump feeds the high-pressure washing liquid to the respective ejecting nozzles 3 of the nozzle unit 4 through the metal-made feed pipe 9, and then through the high-pressure water feed passage 32 of the holder 2 which is connected at one end to the pipe 9. The high-pressure water is ejected from the each of the ejecting nozzles 3 in a single straight-line shape. The metal-made high-pressure washing liquid feed pipe 9 may be, for example, entirely gently curved so long as it is flexible. FIGS. 9B~9D show modification examples 1~3 of the washing liquid feed pipe 9. FIG. 9B shows a washing liquid feed pipe 9' formed by a high-pressure hose, and FIG. 9C shows a state where a spiral metal-made washing liquid feed pipe 9'' is coupled. FIG. 9D shows a state where one end of a fixed washing liquid feed pipe 11 with high stiffness is coupled to the end portion of the rotary shaft 2b via a swivel joint 12.

Thus far, several modification examples of the holder 2 have been described as shown in FIGS. 2 and 3, but the present invention is not limited to these examples. Although not shown, a downstream side of the high-pressure pump is coupled to a tank storing washing liquid or washing water.

Figure 6A:
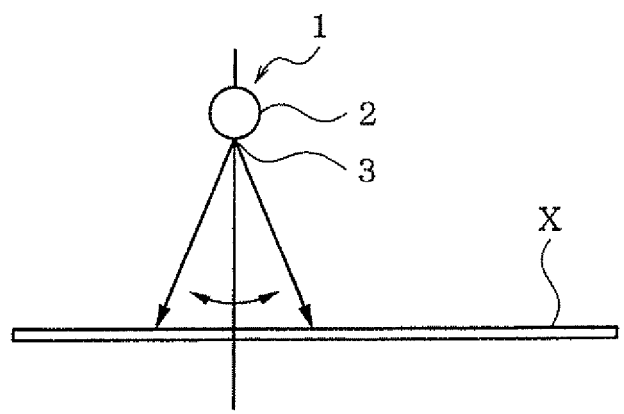
FIG. 6A is a side view showing a washing liquid ejecting state of the washing apparatus of FIG. 1.
Figure 6B:
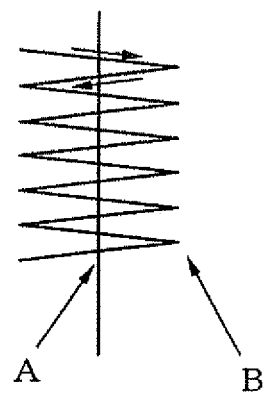
FIG. 6B is a view showing a trajectory of the washing liquid ejected from the ejecting nozzle of the holder of the washing apparatus of FIG. 1 onto an object.
Figure 6C:
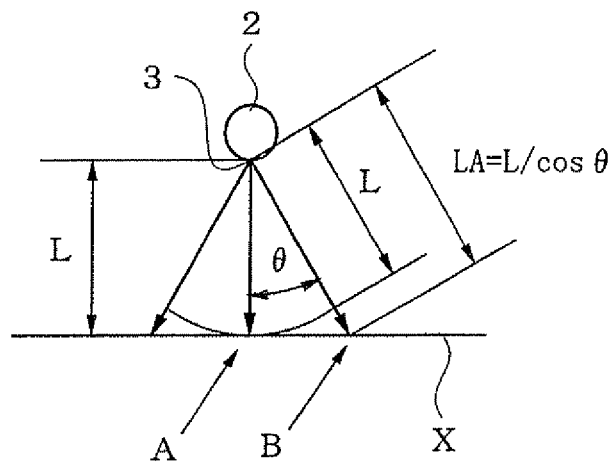
FIG. 6C is a view showing a relationship of a distance (stand-off) from the ejecting nozzle to the object between a location just below the holder and a location of a maximum pivot angle (θ) in the washing apparatus of FIG. 1.

FIG. 6B shows a trajectory of the washing liquid ejected from the ejecting nozzle 3 of the holder 2 onto the object x. At location B where an ejecting direction of the washing liquid from the ejecting nozzle 3 of the holder 2 changes into an opposite direction, a pivot movement speed of the ejecting nozzle 3 is zero. Therefore, at the direction changing location B, an ejecting time of the washing liquid with respect to the object x is longer than that of other region. Generally, when the ejecting time increases, the washing ability is enhanced, causing washing unevenness. However, in the washing apparatus of the present invention, its influence is lessened. As shown in FIG. 6C, when a distance from the ejecting nozzle 3 to the object x right under the ejecting nozzle 3 is L, a distance LA from the ejecting nozzle 3 to the direction changing location B on the object x is L/cos θ. When L=100 mm, and θ=22.5 degrees, LA=L/cos 22.5=108.2 mm. The direction changing location B is 8.2 mm farther from the ejecting nozzle 3 than the location A right under the ejecting nozzle 3. As a result, the washing ability is reduced, and therefore a difference in the washing ability is reduced even when the washing time increases as described below.

Figure 7:
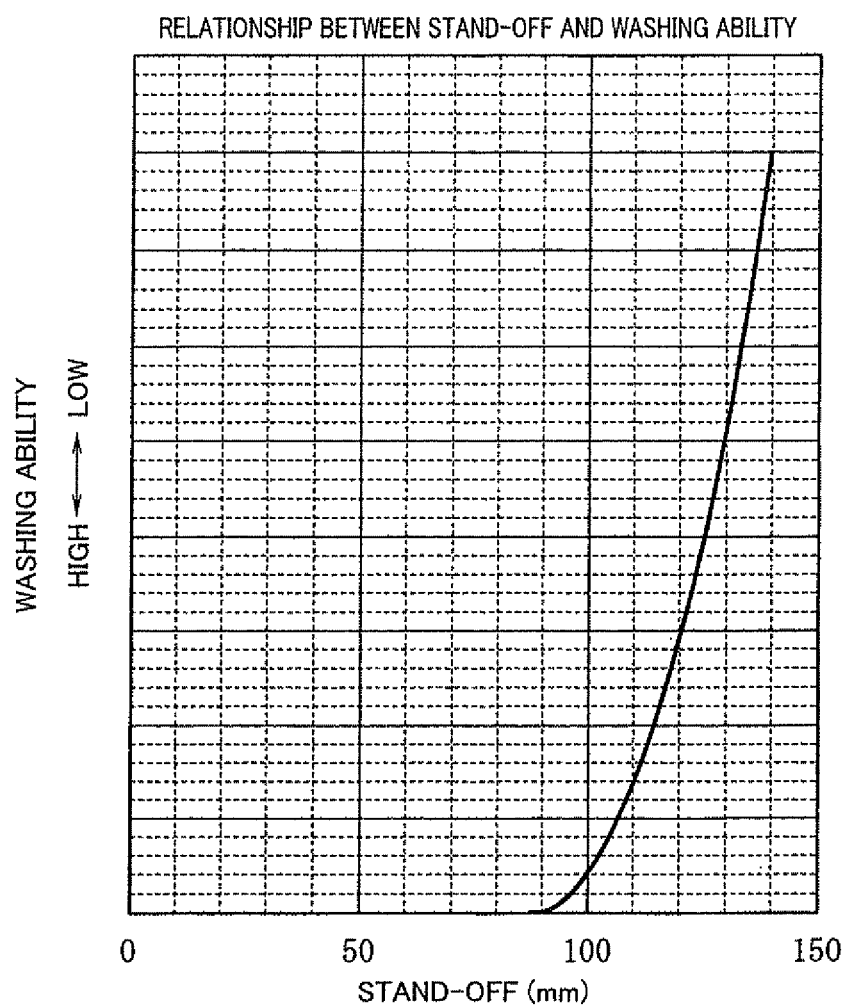
FIG. 7 is a graph showing a relationship between a distance (stand-off) from the ejecting nozzle to the object and the washing ability, and a relationship between the distance and a washing ability corresponding to a time for which the washing liquid ejected penetrates an aluminum foil.

FIG. 7 is a graph showing a relationship between the distance (stand-off) from the ejecting nozzle 3 to the object x and the washing ability, and depicting a relationship between a time for the washing liquid is ejected through an aluminum foil and a distance. As can be seen, the washing ability reduces when the distance increases from 100 mm of L to 108 mm of LA.

Since the washing liquid is ejected to the object x in a direction perpendicular to the object x right under the ejecting nozzle 3, 100% of an ejecting force F of the washing liquid acts on the object x, while an ejecting force Fv is reduced to F cos θ because the force acts on the object x in the direction changing location B such that the ejecting force Fv is tilted at the angle θ.

For the above reason, at the direction changing location B, the washing ability is lower in terms of stand-off and angle than the location A right under the object x. Therefore, an increase in the washing ability which would be caused by the fact that the pivot movement speed is zero, is lessened.

Figure 8A:
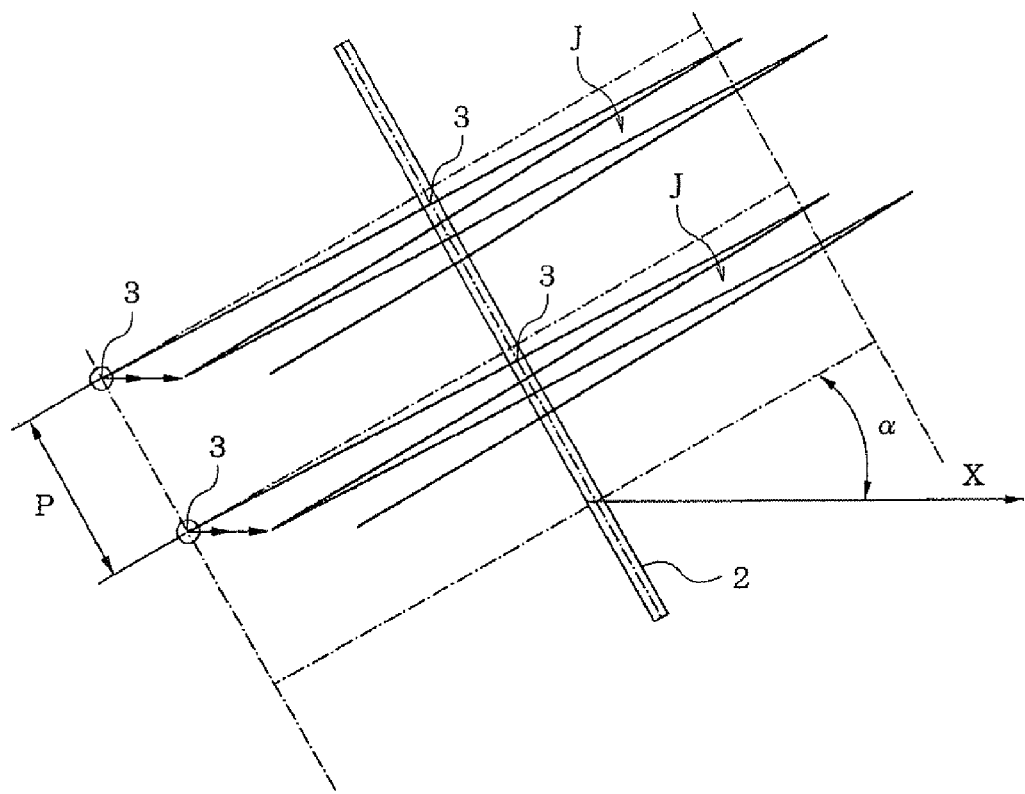
FIG. 8A is a view showing trajectories (zigzag patterns) of the high-pressure washing liquid ejected from two adjacent ejecting nozzles in the holder of the washing apparatus of FIG. 1.
Figure 8B:
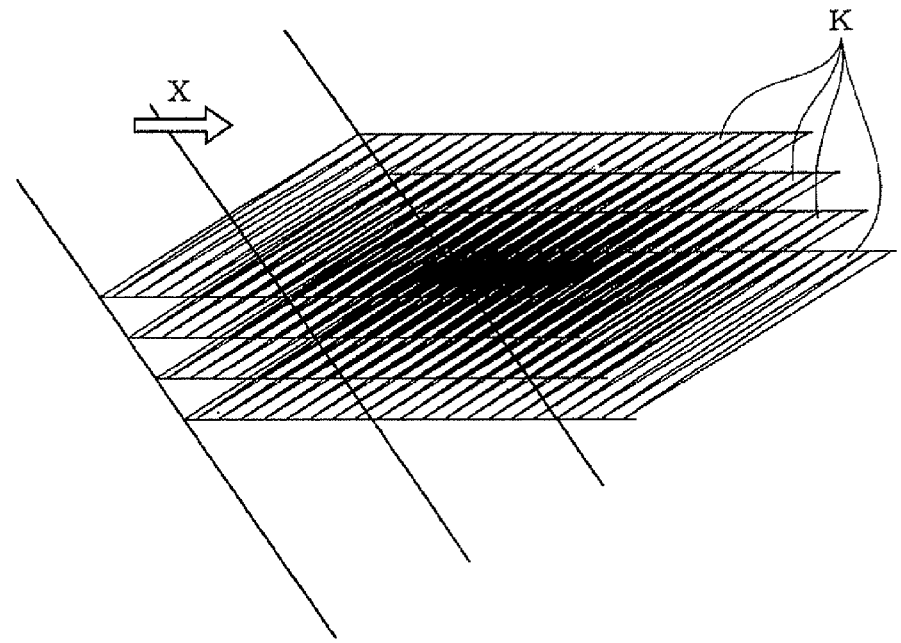
FIG. 8B is a view showing a state in which the object is conveyed to get across a washing region formed by overlapping trajectories of the high-pressure washing liquid ejected from four ejecting nozzles, and washed.

In accordance with the high-pressure washing liquid ejecting washing apparatus 1 of the above example, as shown in FIG. 8A, the holder 2 is pivoted (reciprocatingly rotated) around its axis while ejecting the washing liquid in a single straight-line shape from the respective ejecting nozzles 3 under a high-pressure in a state where the holder 2 is tilted at an angle α with respect to a conveying direction (arrow) of the object x. That is, in accordance with the high-pressure washing liquid ejecting washing apparatus 1 of this embodiment, the washing liquid ejected from the ejecting nozzles 3 arranged with nozzle pitches P on the lower surface of the holder 2 is swung, thereby forming a continuous zigzagshaped washing trajectory J as shown in FIG. 8A. FIG. 8B shows trajectories (zigzag patterns) of the high-pressure washing liquid ejected from the four ejecting nozzles 3. In this example, because of a relationship between the conveying speed of the object x and the pivot speed of the ejecting nozzle 3, the object x conveyed in the arrow direction moves across a washing region K formed by superposing the trajectories of the high-pressure washing liquid ejected from the four ejecting nozzles 3 arranged with nozzle pitches P, as shown in FIG. 8B. As a result, the substantially entire surface of the object x is washed with the washing liquid.

Figure 10A:
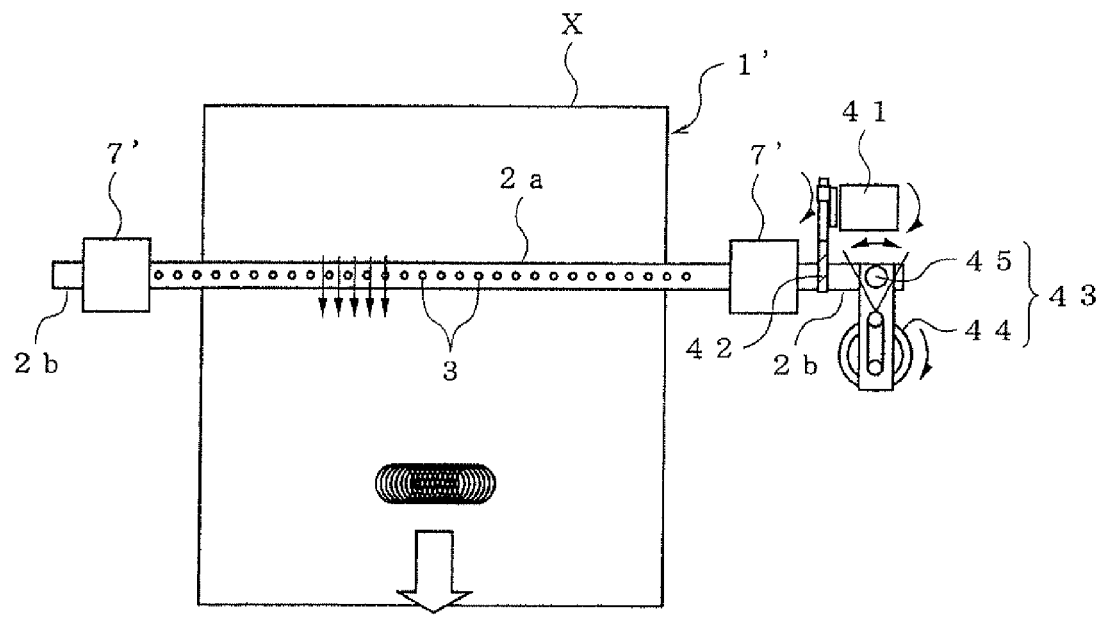
FIG. 10A is a plan view of a high-pressure washing liquid ejecting washing apparatus according to Embodiment 2 of the present invention.
Figure 10B:
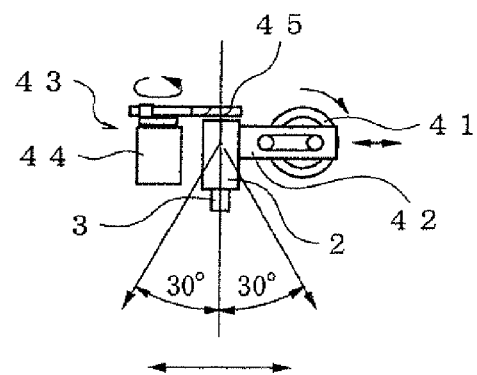
FIG. 10B is a front view schematically showing a drive mechanism of FIG. 10A.

FIG. 10A is a plan view of a high-pressure washing liquid ejecting washing apparatus according to Embodiment 2 of the present invention. FIG. 10B is a front view schematically showing a drive mechanism of FIG. 10A. A washing apparatus 1' of this embodiment is capable of ejecting the washing liquid from the ejecting nozzles 3 to the object x so as to draw a circle shape or an oval shape by adding a horizontal linear movement of the holder 2 in the longitudinal direction to the swingable washing apparatus 1. Therefore, as shown in FIG. 10A, the holder 2 can be disposed in a direction orthogonal to the conveying direction of the object x when viewed from above. In addition to applying a rotational force to the rotary shaft 2b of the holder 2 to reciprocatingly rotate it around its axis, a transmission member 42 serves to transmit a rotational force of a servo motor 41 to the rotary shaft 2b and is coupled to the rotary shaft 2b so as to permit the rotary shaft 2b to perform a reciprocating movement in the longitudinal direction. To this end, bearings 7' at both sides of the holder 2 support the holder 2 such that the holder 2 is rotatable around its longitudinal axis and support the holder 2 such that the holder 2 is movable in the longitudinal direction thereof.

A drive mechanism 43 for providing a reciprocating linear movement to each of the rotary shafts 2b of the holder 2 at constant pitches in the longitudinal direction converts a rotational force of the servo motor 44 in one direction into a reciprocating driving force of the holder 2 in the longitudinal direction, and applies a linear force (reciprocating driving force in a straight-line direction) to the rotary shaft 2b for reciprocating movement. A transmission member 45 for transmitting the linear force of the drive mechanism 43 to the rotary shaft 2b is coupled to the rotary shaft 2b so as to permit its rotation.

Figure 6D:
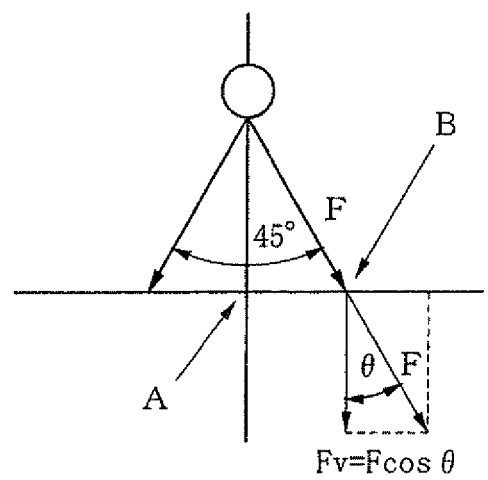
FIG. 6D is a view showing a relationship of a washing ability between the location just below the holder and the location of the maximum pivot angle (θ) in the washing apparatus of FIG. 1.
Figure 11C:
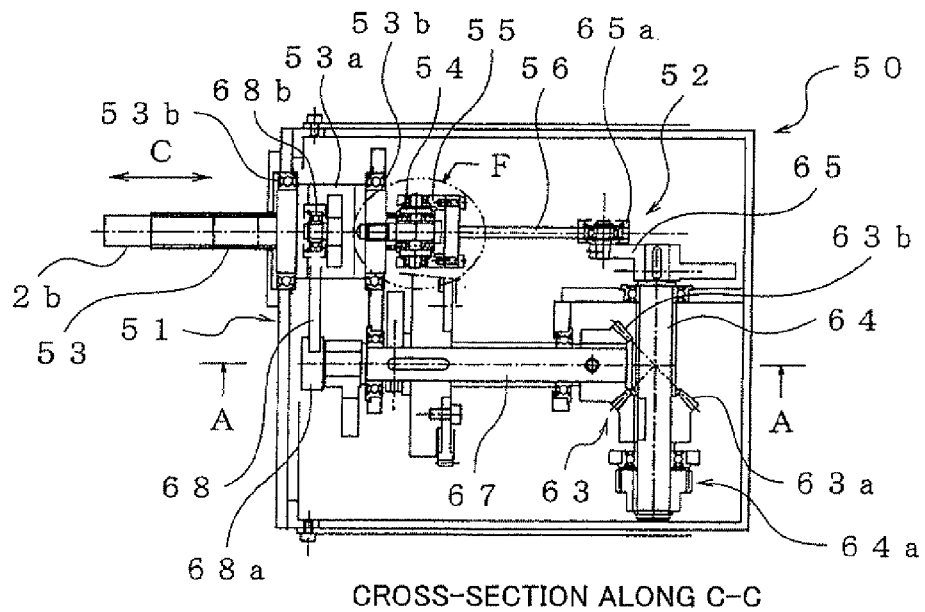
FIG. 11C is a cross-sectional view taken along C-C of FIG. 11A.
Figure 11D:
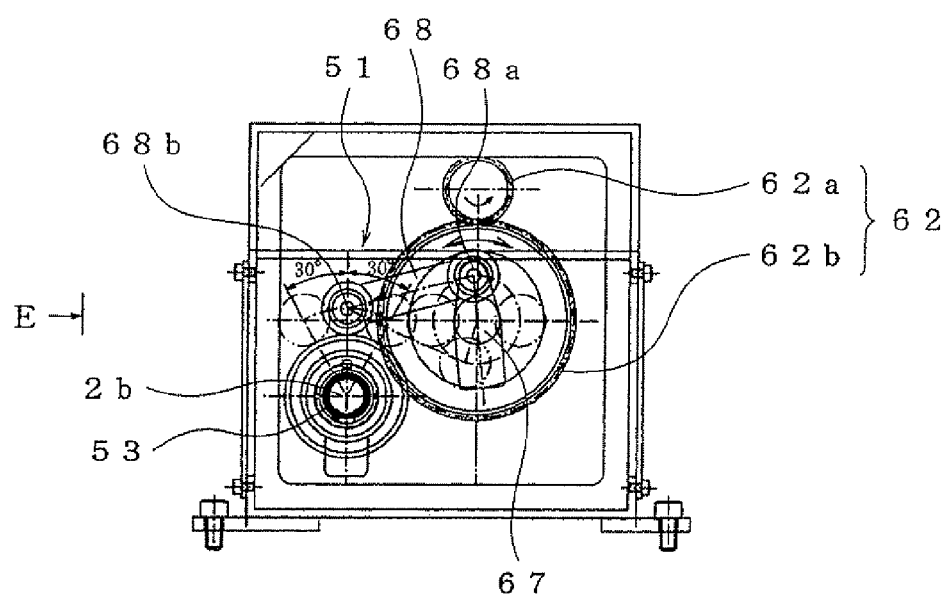
FIG. 11D is a left side view of FIG. 11A.

In accordance with the above configuration, the washing apparatus 1' of this embodiment pivots the holder 2 around its longitudinal axis and reciprocate the holder 2 in the longitudinal direction while ejecting the washing liquid from a plurality of ejecting nozzles 3 under a high-pressure. By synchronizing the pivot movement of the holder 2 around its longitudinal axis with reciprocating linear movement of the holder 2 in the longitudinal direction, the washing liquid is ejected to draw a perfect circle shape or an oval shape. Therefore, the washing liquid is ejected to the entire object x uniformly to effectively wash the object x with a high washing density. In addition, since there is a time lag between the direction changing location B (see FIGS. 6B~6D) in the forward and backward direction of the holder 2 (ejecting nozzle 3) and the direction changing location C (see FIG. 11C) in the longitudinal direction of the holder 2, the washing liquid is not intensively ejected onto a specified region on the object x. Furthermore, a pivot stroke distance of the holder 2 can conform to a reciprocating movement stroke distance of the holder 2 in the longitudinal direction. In this case, the washing liquid is ejected onto the object x to draw a perfect circle shape. By adjusting these stroke distances, the washing liquid can be ejected to draw a desired oval shape as well as the perfect circle shape. Thus, uniformity of washing is ensured with flexibility. The other constituents are identical to those of the high-pressure washing liquid ejecting washing apparatus 1 of Embodiment 1. They are designated by the same reference symbols and will not be described repetitively.

The high-pressure washing liquid ejecting washing apparatus 1' has a simpler structure than the washing apparatus of a previous application and provides a washing action similar to that of the washing apparatus of the previous application. An acceleration of the holder in the forward and backward direction is balanced more easily than that of the washing apparatus of the previous application. Therefore, the high-pressure washing liquid ejecting washing apparatus 1' is handled easily.

Figure 11E:
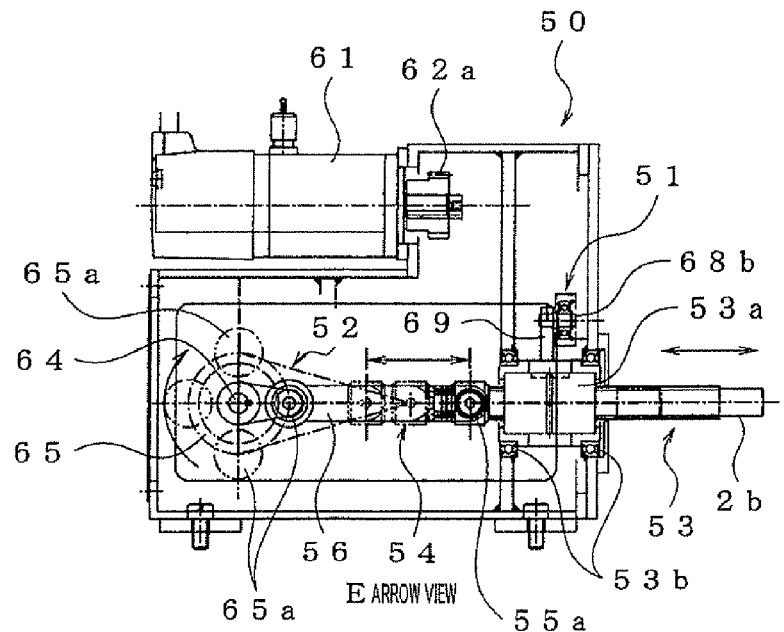
FIG. 11E is a view taken in the direction of arrow along E of FIG. 11D.
Figure 11F:
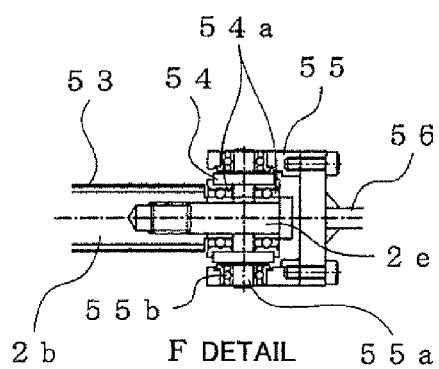
FIG. 11F is an enlarged view of F part of FIG. 11C in detail.
Figure 12:
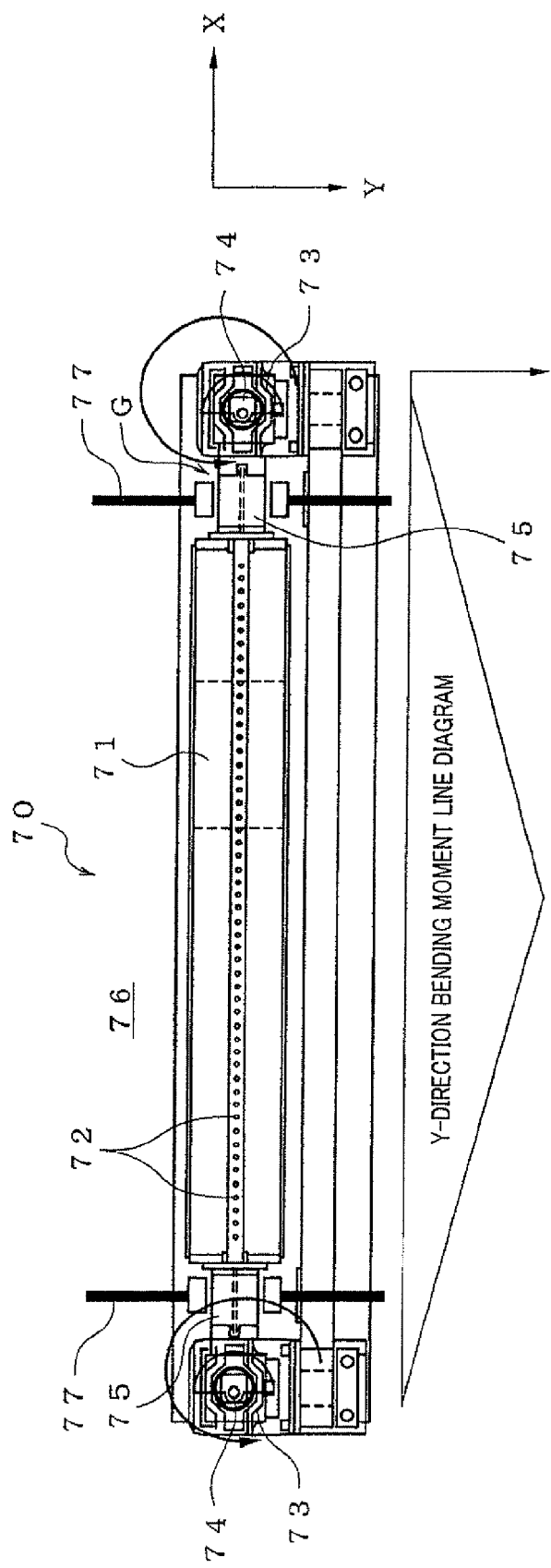
FIG. 12 is a plan view showing a washing apparatus of a previous application, having a configuration in which a holder attached with a plurality of high-pressure water ejecting nozzles is rotated in a circular shape within a horizontal plane while drive shafts at both sides are eccentrically rotated.

FIGS. 11A~11F are views showing a modification example of the drive mechanism of the high-pressure washing liquid ejecting washing apparatus 1' in detail. As shown in FIGS. 11A~11F, a drive mechanism 50 of this example is configured in such a manner that a common motor 61 causes the holder 2 to perform a reciprocating pivot movement around its longitudinal direction and a linear reciprocating movement in the longitudinal direction via gear mechanisms 62, 63, by piston and crank mechanism 51, 52. As shown in FIGS. 11A~11F, the rotary shaft 2b is capable of a reciprocating linear movement in the longitudinal direction thereof by a spline mechanism 53 provided at one end portion thereof. As shown in FIG. 11F, a rotation coupling member 54 adjacent to a cylindrical outer tube 53a (in FIG. 11C, adjacent to right side of the outer tube 53a) covering a periphery of a part of the spline mechanism 53 rotatably couples one end portion of the rotary shaft 2b via a bearing 54a and a small-diameter support rod 2e. The small-diameter support rod 2e is rotatably integrally coupled to one end portion of the rotary shaft 2b. The rotation coupling member 54 is inserted with a slack into a horse-shoe-shaped cover 55 having an open end. In this state, the rotation coupling member 54 is coupled to the horse-shoe-shaped cover 55 such that they are bendable around a pivot 55a via the pivot 55a and a bearing 55b. As shown in FIG. 11F, an opposite end center portion of the horse-shoe-shaped cover 55 is coupled to a piston member 65a of the piston crank mechanism 52 by a connecting rod 56. Therefore, the outer tube 53a reciprocatingly rotates by a predetermined angle θ around the rotary shaft 2b while permitting a reciprocating movement of the rotary shaft 2b in the longitudinal direction by the spline mechanism 53. The outer tube 53a is rotatably mounted to a casing of an apparatus body via the bearing 53b.

Initially, the rotation of the motor 61 is speed-reduced via the gear mechanism 62 (gear 62a, gear 62b) and is transmitted to a first rotation driving shaft 67, which rotates. One end of the crank 68 is coupled to a tip end of the rotation driving shaft 67 via a bearing 68a such that the crank 68 is rotatable around the axis, while a piston member 68b at an opposite end of the crank 68 is pivotally coupled to one end of the lever 69. An opposite end of the lever 69 is coupled to the outer tube 54 such that the lever 69 is rotatable integrally with the outer tube 54. A second rotation driving shaft 60 is disposed to extend in a direction orthogonal to the first rotation driving shaft 67. The rotation of the first rotation driving shaft 67 is transmitted via bevel gears 63a, 63b to the second rotation driving shaft 60, which rotates simultaneously with the rotation of the first rotation driving shaft 67. A third rotation driving shaft 64 is disposed to extend in parallel with the second rotation driving shaft 60. The rotation of the second rotation driving shaft 60 is transmitted to the third rotation driving shaft 64 via the gears 60a, 64a. When the third rotation driving shaft 64 rotates in one direction, the crank 65 at the tip end rotates, and the rotary shaft 2b performs a linear reciprocation movement in the longitudinal direction along with the holder 2 via the piston member 65a at the tip end of the crank 65, the connecting rod 56 and the rotation coupling member 54. A pivot movement of the connecting rod 56 by the crank 65 at the piston member 65a side is absorbed by a bending movement of an opposite end side of the connecting rod 56 around the pivot 55a of the rotation coupling member 54. The first rotation driving shaft 67 is disposed in parallel with the connecting rod 56.

An operation of the high-pressure washing liquid ejecting washing apparatus 1' configured as described above will be described.

As shown in FIGS. 11A~11F, when the motor 61 starts rotating, the first rotation driving shaft 67 rotates via the gear mechanism 62, and at the same time, the second rotation driving shaft 60 rotates via the bevel gear mechanism 63. Further, the rotation is transmitted to the third rotation driving shaft 64 via the gears 60a, 64a, causing the third rotation driving shaft 64 to rotate. According to the rotation of the rotation driving shaft 64, the crank 65 rotates, and the opposite end (piston member 65a) side of the connecting rod 56 is pivoted around the pivot 55a of the rotation coupling member 54 in the direction orthogonal to the axis of the connecting rod 56 as shown in FIG. 11E, via the piston member 65a at the tip end of the crank 65 and the connecting rod 56, while the rotary shaft 2b of the holder 2 performs a linear reciprocating movement in the longitudinal direction, so that the holder 2 performs a reciprocating linear movement along the longitudinal direction, along with the rotary shaft 2b. Since the first rotation driving shaft 67 rotates together with the crank 68, the crank 68 rotates and the piston member 68b at its tip end reciprocatingly rotates by a predetermined angle, while the holder 2 is pivoted around its longitudinal axis along with the rotary shaft 2b via the lever 69 and the outer tube 53a. The linear reciprocating movement of the holder 2 in the longitudinal direction by the rotation coupling member 54 is permitted by the spline mechanism 53 and the pivot movement of the outer tube 53a is not impeded. In contrast, the pivot movement of the rotation coupling member 54 is permitted by the bearing 54a (FIG. 11F) and therefore the linear reciprocating movement of the rotary shaft 2b is not impeded. As a result, the holder 2 is capable of the reciprocating pivot movement around the axis of the rotary shaft 2b and the reciprocating linear movement in the longitudinal direction concurrently, according to a rotation of a common (single) motor 61.

Thus far, several examples of the high-pressure washing liquid ejecting washing apparatus of the present invention are described, but the present invention is not limited to these. For example, although in the above examples, ejecting nozzles 3 are aligned at constant intervals on the lower surface of the holder 2, they may be arranged in two or three rows in zigzag shape at equal intervals.

The invention claimed is:

1. A high-pressure washing liquid ejecting washing apparatus comprising:
    a conveyor mechanism that conveys an object in a predetermined direction;
    a bar-shaped holder; and
    a plurality of high-pressure washing liquid ejecting nozzles arranged at constant intervals along a longitudinal direction of the bar-shaped holder, the holder being supported at both sides in a longitudinal direction thereof such that the holder is rotatable around its longitudinal axis, the holder being reciprocatingly rotated around the longitudinal axis within a predetermined rotational angle and the ejecting nozzles ejecting a high-pressure washing liquid to a washed surface of an object in a single straight-line shape to wash the object while the object is conveyed at a constant speed with respect to the holder by the conveyor mechanism,
    wherein the holder extends across the predetermined direction and is disposed such that the holder is oblique with respect to the predetermined direction, when viewed from a normal line direction of the washed surface.

2. The high-pressure washing liquid ejecting washing apparatus according to claim 1, wherein:
    the ejecting nozzles are arranged along the longitudinal direction of the holder on a lower surface of the holder;
    the holder is provided with a high-pressure washing liquid feed passage which extends along the longitudinal direction of the holder in a straight-line shape and communicates with the ejecting nozzles;
    one end of a flexible high-pressure washing liquid feed pipe is coupled to an end portion of the high-pressure washing liquid feed passage; and
    rotary shafts are attached to longitudinal both end surfaces of the holder such that the rotary shafts are rotatable integrally with the holder.

3. The high-pressure washing liquid ejecting washing apparatus according to claim 1,
    wherein the holder is a block body having a rectangular cross-section in a direction orthogonal to the longitudinal direction of the holder, tubular members with a rectangular cross-section which open toward the holder are provided integrally with one end portions of the rotary shafts, both end portions of the block body are fittingly inserted into the tubular members, respectively, and each of the end portions of the block body is fastened integrally to the tubular member by a bolt penetrating the end portion of the block body and the tubular member.

4. The high-pressure washing liquid ejecting washing apparatus according to claim 1, wherein:
    the holder is supported at both sides thereof such that the holder is rotatable around the longitudinal axis and is movable along the longitudinal direction; and
    the holder is reciprocatingly rotatable around the longitudinal axis within a predetermined rotational angle and is reciprocatingly movable within a predetermined dimension in the longitudinal direction.

5. The high-pressure washing liquid ejecting washing apparatus according to claim 4, wherein:
    a common motor gives a rotational force to the rotary shafts of the holder to reciprocatingly rotate the rotary shafts around the longitudinal axis while permitting a reciprocating movement of the rotary shafts in the longitudinal direction; and
    the common motor gives a force to the rotary shafts of the holder to cause the rotary shaft to perform a reciprocating linear movement in the longitudinal direction while permitting a rotation of the rotary shafts around the longitudinal direction.

6. The high-pressure washing liquid ejecting washing apparatus according to claim 4,
    wherein a reciprocating rotation stroke distance of the holder around the longitudinal axis is equal to a reciprocating stroke distance of the holder in the longitudinal direction.

7. The high-pressure washing liquid ejecting washing apparatus according to claim 1,
    wherein the holder is reciprocatingly rotated around the longitudinal axis symmetrically with respect to a rotational position where the high-pressure washing liquid is ejected to the washed surface in a direction perpendicular to the washed surface.

8. The high-pressure washing liquid ejecting washing apparatus according to claim 4,
wherein there is a time lag between a direction changing point around the longitudinal axis of the holder and a direction changing point in the longitudinal direction of the holder.

9. The high-pressure washing liquid ejecting washing apparatus according to claim 1,
wherein the high-pressure washing liquid is ejected to the washed surface of the object forming a washing trajectory with a zigzag shape.

* * * * *